United States Patent
Li

(10) Patent No.: US 10,249,652 B2
(45) Date of Patent: Apr. 2, 2019

(54) MANUFACTURING METHOD OF FLEXIBLE TFT SUBSTRATE

(71) Applicant: Wuhan China Star Optoelectronics Semiconductor Display Technology Co., Ltd., Wuhan (CN)

(72) Inventor: Songshan Li, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/569,775

(22) PCT Filed: Aug. 16, 2017

(86) PCT No.: PCT/CN2017/097602
§ 371 (c)(1),
(2) Date: Oct. 27, 2017

(87) PCT Pub. No.: WO2018/227750
PCT Pub. Date: Dec. 20, 2018

(65) Prior Publication Data
US 2018/0366496 A1    Dec. 20, 2018

(30) Foreign Application Priority Data

Jun. 16, 2017 (CN) .......................... 2017 1 0459311

(51) Int. Cl.
*H01L 21/00* (2006.01)
*H01L 21/84* (2006.01)
(Continued)

(52) U.S. Cl.
CPC .... *H01L 27/1288* (2013.01); *H01L 21/76802* (2013.01); *H01L 27/127* (2013.01);
(Continued)

(58) Field of Classification Search
None
See application file for complete search history.

(56) References Cited

U.S. PATENT DOCUMENTS

| | | | |
|---|---|---|---|
| 2006/0138922 A1* | 6/2006 | Kim | H01L 27/3244 313/11 |
| 2010/0140706 A1 | 6/2010 | Koo et al. | |
| 2014/0374718 A1* | 12/2014 | Hsu | H01L 27/127 257/40 |

FOREIGN PATENT DOCUMENTS

| | | |
|---|---|---|
| CN | 104350532 A | 2/2015 |
| CN | 106054470 A | 10/2016 |

(Continued)

*Primary Examiner* — Thien F Tran
(74) *Attorney, Agent, or Firm* — Leong C. Lei

(57) ABSTRACT

The invention provides a manufacturing method of flexible TFT substrate, forming first contact hole above two sides of the active layer and buffer hole on flexible base substrate after depositing a silicon oxide layer of interlayer dielectric layer (ILD), coating organic photo-resist material on the silicon oxide layer and filling the organic photo-resist material into the buffer hole during coating to form organic photo-resist layer to obtain ILD including silicon oxide layer and organic photo-resist layer, and patternizing organic photo-resist layer to form a connection hole corresponding to above of first contact hole so that the subsequent source/drain connected to active layer through the first contact holes and connection holes. By replacing the silicon nitride layer in conventional ILD with flexible organic photo-resist layer and providing buffer hole filled with organic photo-resist material on flexible base substrate, the flexibility of TFT substrate is enhanced and product performance improved.

15 Claims, 4 Drawing Sheets

(51) Int. Cl.
  *H01L 27/12*  (2006.01)
  *H01L 27/32*  (2006.01)
  *H01L 51/00*  (2006.01)
  *H01L 21/768*  (2006.01)

(52) U.S. Cl.
  CPC ...... *H01L 27/1218* (2013.01); *H01L 27/1262* (2013.01); *H01L 27/3246* (2013.01); *H01L 27/3262* (2013.01); *H01L 51/0097* (2013.01); *G02F 2201/123* (2013.01)

(56) References Cited

FOREIGN PATENT DOCUMENTS

| | | |
|---|---|---|
| CN | 106356380 A | 1/2017 |
| CN | 106783881 A | 5/2017 |
| JP | 2014146610 A | 8/2014 |

\* cited by examiner

MANUFACTURING METHOD OF FLEXIBLE TFT SUBSTRATE

BACKGROUND OF THE INVENTION

1. Field of the Invention

The present invention relates to the field of display techniques, and in particular to a manufacturing method of flexible TFT substrate.

2. The Related Arts

In the field of display technology, the panel display technology has replaced cathode ray tube (CRT) display. Because of the advantages of high display quality, low power-consumption, thinness and wide applications, the e panel display device has been widely used in mobile phones, TV, PDA, digital camera, notebook PC, desktop PC, and other consumer electronic products, and becomes the mainstream of the display device.

The thin film transistor (TFT) is the main driving element used in the liquid crystal display (LCD) and active matrix organic light-emitting diode (AMOLED) display device, and is directly related to future progress of the high-performance panel display device.

The TFT includes various structures, as well as various materials for manufacturing the active layer of TFT of corresponding structure. Among the options, the low temperature poly-silicon (LTPS) material is one of the preferred options. Due to the regular atomic arrangement of LTPS, the carrier migration rate is high. For voltage-driven LCD display devices, the smaller-sized TFT can be used to realize the LTPS TFT to achieve deflection driving on the liquid crystal (LC) molecules because of the high migration rate of LTPS TFT, which greatly reduces the volume of the TFT, increase light transmission area, obtain higher brightness and resolution. For the current-driven AMOLED display device, the LTPS TFT can better meet the drive current requirements, and can be applied to flexible organic light-emitting diode (OLED) substrate, and arouse widespread attention in recent years.

In the TFT substrate, the gate of the TFT is located on the same layer as the gate line to form a first metal layer, the source and the drain of the TFT and the data line are located on the same layer to form a second metal layer. An interlayer dielectric (ILD) layer must be provided between the first metal layer and the second metal layer as an insulating layer for isolating the first metal layer from the second metal layer. At present, in conventional flexible TFT substrates, the ILD layer is typically a two-layer inorganic film layer comprising a silicon oxide (SiOx) layer and a silicon nitride (SiNx) layer. However, in recent years, flexible TFT technology is becoming more and more demanding, so the conventional laminated inorganic film ILD material is difficult to meet the requirements of flexible substrate.

SUMMARY OF THE INVENTION

The object of the present invention is to provide a manufacturing method of flexible TFT substrate, able to effectively improve the flexibility of the flexible TFT substrate and enhance product performance.

To achieve the above object, the present invention provides a manufacturing method of flexible TFT substrate, comprising the steps of:

Step S1: providing a flexible base substrate, depositing a buffer layer on the flexible base substrate, depositing and patternizing to form an active layer on the buffer layer, depositing a gate insulating layer on the active layer and the buffer layer, depositing and patternizing to form a gate on the gate insulating layer;

Step S2: depositing a silicon oxide layer on the gate and the gate insulating layer, patternizing the silicon oxide layer and the gate insulating layer to form a first contact hole respectively to corresponding to above of each of two sides of the active layer and form a buffer hole above the base substrate with an interval from the first contact hole, the first contact hole penetrating the silicon oxide layer and the gate insulating layer to expose the two sides of the active layer, the buffer hole having a larger size than the first contact hole, and the buffer hole having a deeper depth than the first contact hole;

Step S3: coating an organic photo-resist material on the silicon oxide layer to form an organic photo-resist layer, the organic photo-resist material filling the buffer holes during coating, the silicon oxide layer and the organic photo-resist layer together forming an interlayer dielectric layer, patternizing the organic photo-resist layer to form connection holes above the first contact holes so as to expose the first contact holes;

Step S4: depositing and patternizing on the interlayer dielectric layer to form a source and a drain, the source and the drain contacting respectively the two sides of the active layer through the first contact holes and the connection holes.

According to a preferred embodiment of the present invention, Step S2 of forming the first contact holes and the buffer holes specifically comprises: coating a photo-resist material on the silicon oxide, using a mask to perform exposure and lithography on the photo-resist material to obtain a shielding photo-resist layer, the shielding photo-resist layer comprising first openings and second openings to form the first contact holes and the buffer holes, using the shielding photo-resist layer as a shielding layer to perform dry etching on the silicon oxide layer and the gate insulating layer to form corresponding first contact holes beneath the first openings and form corresponding buffer holes beneath the second openings, and then removing the shielding photo-resist layer.

According to a preferred embodiment of the present invention, the buffer holes are wider than the first contact holes by 5-10 µm.

According to a preferred embodiment of the present invention, the organic photo-resist material is polyimide.

According to a preferred embodiment of the present invention, the manufacturing method of flexible TFT substrate further comprises Step S5: forming a planarization layer on the source, the drain and the interlayer dielectric layer, patternizing the planarization layer to form a second contact hole corresponding to above of the drain, depositing and patternizing on the planarization layer to form a pixel electrode, the pixel electrode contacting the drain through the second contact hole, forming a pixel definition layer on the pixel electrode and the planarization layer, forming a supporter on the pixel definition later;

the pixel definition layer being disposed with an opening corresponding to above of the pixel electrode, the opening defining an OLED light-emitting area, and the pixel electrode being an OLED anode.

According to a preferred embodiment of the present invention, Step S1 of forming the active layer specifically comprises: depositing an amorphous silicon (a-Si) thin film on the buffer layer, converting the a-Si thin film into a polycrystalline silicon thin film by an excimer laser annealing crystallization process, and then patternizing the polycrystalline silicon thin film to obtain an active layer.

According to a preferred embodiment of the present invention, Step S1 further comprises: using the gate as a shielding layer to performing P-type doping on the two sides of the active layer.

According to a preferred embodiment of the present invention, when performing P-type doping in step S1, the ions doped into the active layer are boron ions.

According to a preferred embodiment of the present invention, the gate, the source and the drain are made of one or more of the materials of molybdenum (Mo), aluminum (Al), copper (Cu), titanium (Ti), and chromium (Cr); the buffer layer and the gate insulating layer are made of one or more of the materials of silicon oxide and silicon nitride.

According to a preferred embodiment of the present invention, the pixel definition layer and the support are made of the same material, and the same material is an organic photo-resist material; in Step S5, the pixel definition layer and the support are formed simultaneously by using a halftone mask plate.

The present invention also provides manufacturing method of flexible TFT substrate, comprising the steps of:

Step S1: providing a flexible base substrate, depositing a buffer layer on the flexible base substrate, depositing and patternizing to form an active layer on the buffer layer, depositing a gate insulating layer on the active layer and the buffer layer, depositing and patternizing to form a gate on the gate insulating layer;

Step S2: depositing a silicon oxide layer on the gate and the gate insulating layer, patternizing the silicon oxide layer and the gate insulating layer to form a first contact hole respectively to corresponding to above of each of two sides of the active layer and form a buffer hole above the base substrate with an interval from the first contact hole, the first contact hole penetrating the silicon oxide layer and the gate insulating layer to expose the two sides of the active layer, the buffer hole having a larger size than the first contact hole, and the buffer hole having a deeper depth than the first contact hole;

Step S3: coating an organic photo-resist material on the silicon oxide layer to form an organic photo-resist layer, the organic photo-resist material filling the buffer holes during coating, the silicon oxide layer and the organic photo-resist layer together forming an interlayer dielectric layer, patternizing the organic photo-resist layer to form connection holes above the first contact holes so as to expose the first contact holes;

Step S4: depositing and patternizing on the interlayer dielectric layer to form a source and a drain, the source and the drain contacting respectively the two sides of the active layer through the first contact holes and the connection holes;

wherein Step S2 of forming the first contact holes and the buffer holes specifically comprising: coating a photo-resist material on the silicon oxide, using a mask to perform exposure and lithography on the photo-resist material to obtain a shielding photo-resist layer, the shielding photo-resist layer comprising first openings and second openings to form the first contact holes and the buffer holes, using the shielding photo-resist layer as a shielding layer to perform dry etching on the silicon oxide layer and the gate insulating layer to form corresponding first contact holes beneath the first openings and form corresponding buffer holes beneath the second openings, and then removing the shielding photo-resist layer;

wherein the buffer holes being wider than the first contact holes by 5-10 μm;

wherein Step S1 of forming the active layer specifically comprising: depositing an amorphous silicon (a-Si) thin film on the buffer layer, converting the a-Si thin film into a polycrystalline silicon thin film by an excimer laser annealing crystallization process, and then patternizing the polycrystalline silicon thin film to obtain an active layer;

wherein Step S1 further comprising: using the gate as a shielding layer to performing P-type doping on the two sides of the active layer.

wherein the gate, the source and the drain being made of one or more of the materials of molybdenum (Mo), aluminum (Al), copper (Cu), titanium (Ti), and chromium (Cr); the buffer layer and the gate insulating layer being made of one or more of the materials of silicon oxide and silicon nitride.

Compared to the known techniques, the present invention provides the following advantages. The present invention provides a manufacturing method of flexible TFT substrate, wherein a first contact hole is formed above the two sides of the active layer and a buffer hole is formed on the flexible base substrate after depositing a silicon oxide layer of the interlayer dielectric layer, and then coating the organic photo-resist material on the silicon oxide layer and filling the organic photo-resist material into the buffer hole during the coating process to form an organic photo-resist layer to obtain an interlayer dielectric layer formed by the silicon oxide layer and the organic photo-resist layer, and then patternizing the organic photo-resist layer to form a connection hole corresponding to above of the first contact hole so that the subsequent source and drain are connected to the active layer through the first contact holes and the connection holes. By replacing the silicon nitride layer in the conventional interlayer dielectric layer with a flexible organic photo-resist layer and providing a buffer hole filled with an organic photo-resist material on the flexible base substrate, the flexibility of the flexible TFT substrate is greatly enhanced and the product performance improved.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
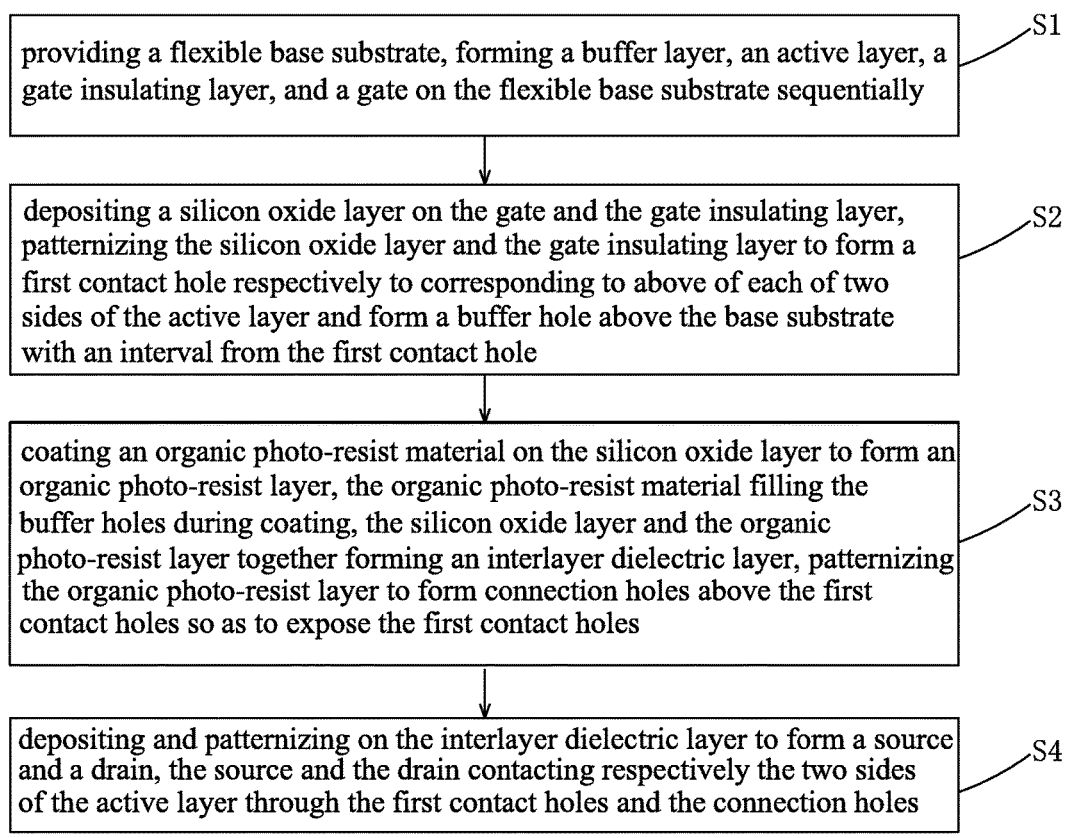
FIG. 1 is a schematic view showing a flowchart of the manufacturing method of flexible TFT substrate provided by an embodiment of the present invention.
Figure 2:
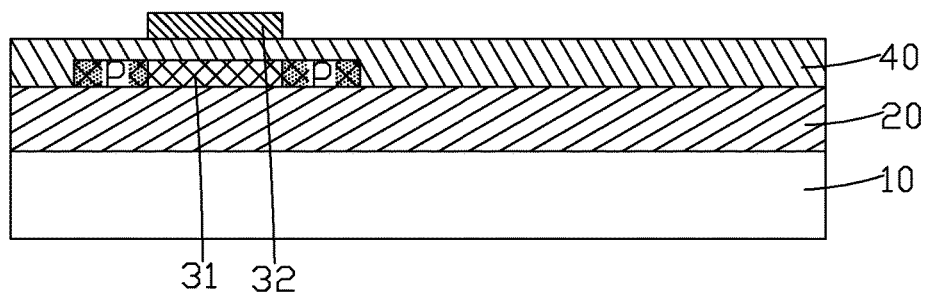
FIG. 2 is a schematic view showing Step S1 of the manufacturing method of flexible TFT substrate provided by an embodiment of the present invention.

Referring to FIG. 1, the present invention provides a manufacturing method of flexible TFT substrate, comprising the steps of:

Step S1: as shown in FIG. 2, providing a flexible base substrate 10, depositing a buffer layer 20 on the flexible base substrate 10, depositing and patternizing to form an active layer 31 on the buffer layer 20, depositing a gate insulating layer 40 on the active layer 31 and the buffer layer 20, depositing and patternizing to form a gate 32 on the gate insulating layer 31.

Specifically, Step S1 of forming the active layer 31 comprises: depositing an amorphous silicon (a-Si) thin film on the buffer layer 20, converting the a-Si thin film into a polycrystalline silicon (poly-Si) thin film by an excimer laser annealing crystallization process, and then patternizing the polycrystalline silicon thin film to obtain an active layer 31.

Specifically, Step S1 further comprises: using the gate 32 as a shielding layer to performing P-type or N-type doping on the two sides of the active layer 31 to form P-type TFT or N-type TFT respectively. Moreover, Step S1 performs P-type doping on the two sides of the active layer 31, wherein when performing P-type doping in step 51, the ions doped into the active layer 31 are boron ions or gallium ions; preferably, when performing P-type doping in step 51, the ions doped into the active layer 31 are boron ions.

Specifically, the flexible base substrate 10 is a polyimide (PI) substrate.

Figure 3:
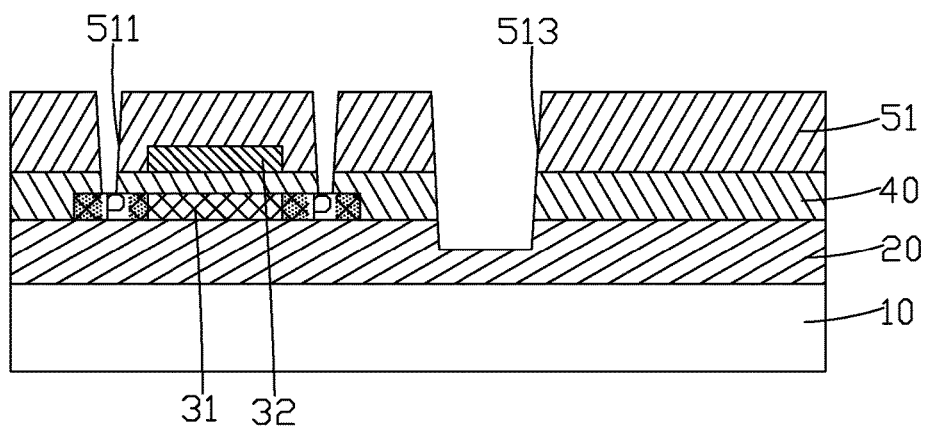
FIG. 3 is a schematic view showing Step S2 of the manufacturing method of flexible TFT substrate provided by an embodiment of the present invention.

Step S2: as shown in FIG. 3, depositing a silicon oxide layer 51 on the gate 32 and the gate insulating layer 40, patternizing the silicon oxide layer 51 and the gate insulating layer 40 to form a first contact holes 511 respectively to corresponding to above of each of two sides of the active layer 31 and form a buffer hole 513 above the base substrate 10 with an interval from the first contact hole 511, the first contact hole 511 penetrating the silicon oxide layer 51 and the gate insulating layer 40 to expose the two sides of the active layer 31, the buffer hole 513 having a larger size than the first contact hole 511, and the buffer hole 513 having a deeper depth than the first contact hole 511.

Specifically, Step S2 of forming the first contact holes 511 and the buffer holes 513 specifically comprises: coating a photo-resist material on the silicon oxide layer 51, using a mask to perform exposure and lithography on the photo-resist material to obtain a shielding photo-resist layer (not shown), the shielding photo-resist layer comprising first openings and second openings to form the first contact holes 511 and the buffer holes 513, so as to define the locations and the sizes of the first contact holes 511 and the buffer holes 513, the second openings being larger than the first openings, and the number of the second openings being less than the number of the first openings, the first openings corresponding to the above of the two sides of the active layer 31, i.e., located above the area formed by TFT of the flexible base substrate 10, and the second openings corresponding to the above of the non-TFT area of the flexible base substrate 10; using the shielding photo-resist layer as a shielding layer to perform dry etching on the silicon oxide layer 51 and the gate insulating layer 40 to form corresponding first contact holes 511 beneath the first openings and form corresponding buffer holes 513 beneath the second openings above the non-TFT area, because the second openings being larger than the first openings, and the number of the second openings being less than the number of the first openings, the etching on the buffer holes 513 being faster and resulting in the buffer holes 513 deeper than the first contact holes 511; and then removing the shielding photo-resist layer.

Specifically, the buffer holes 513 are wider than the first contact holes 511 by 5-10 µm.

Figure 4:
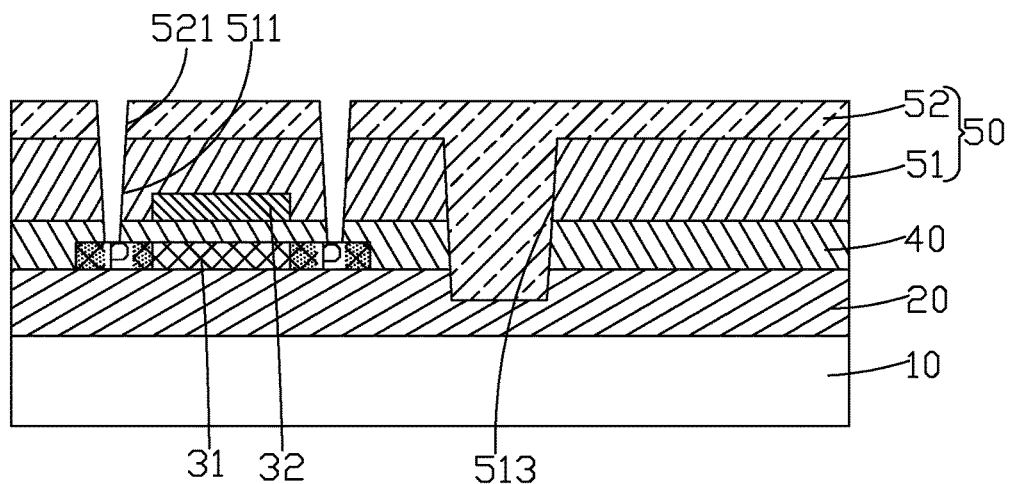
FIG. 4 is a schematic view showing Step S3 of the manufacturing method of flexible TFT substrate provided by an embodiment of the present invention.

Step S3: as shown in FIG. 4, coating an organic photo-resist material on the silicon oxide layer 51 to form an organic photo-resist layer 52, during coating, because the buffer holes 513 being larger, the organic photo-resist material filling the buffer holes 513 during coating, the silicon oxide layer 51 and the organic photo-resist layer 52 together forming an interlayer dielectric layer 50, patternizing the organic photo-resist layer 52 to form connection holes 521 above the first contact holes 511 so as to expose the first contact holes 511.

Specifically, the organic photo-resist layer 52 is made of an organic photo-resist material with better flexibility, such as, polyimide.

Figure 5:
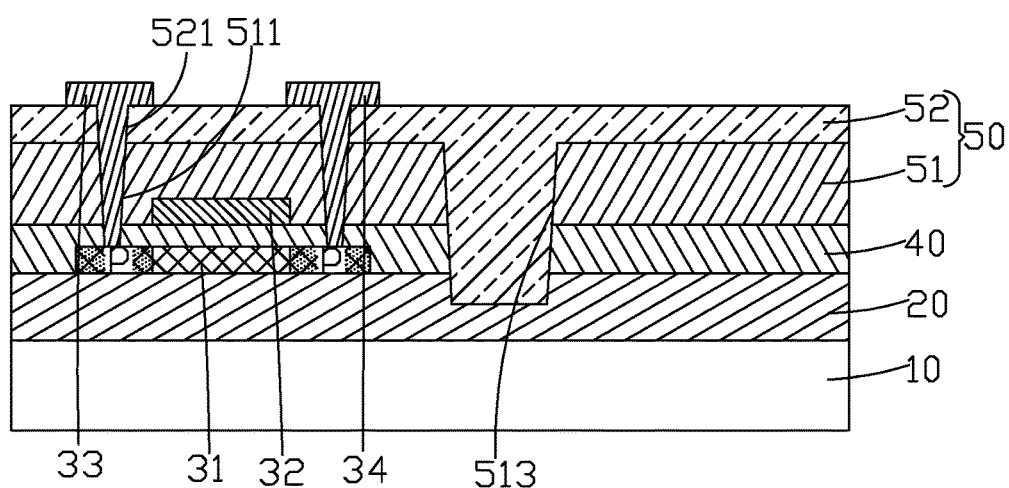
FIG. 5 is a schematic view showing Step S4 of the manufacturing method of flexible TFT substrate provided by an embodiment of the present invention.

Step S4: as shown in FIG. 5, depositing and patternizing on the interlayer dielectric layer 50 to form a source 33 and a drain 34, the source 33 and the drain 34 contacting respectively the two sides of the active layer 31 through the first contact holes 511 and the connection holes 521.

Specifically, in Step S4, the active layer 31, the gate 32, the source 33, and the drain 34 together form the P-type TFT as shown in FIG. 5.

The manufacturing method of flexible TFT substrate of the present invention forms a first contact hole 511 above the two sides of the active layer 31 and a buffer hole 513 on the flexible base substrate 10 after depositing a silicon oxide layer 51 of the interlayer dielectric layer 50, and then coats the organic photo-resist material on the silicon oxide layer 51 and fills the organic photo-resist material into the buffer hole 513 during the coating process to form an organic photo-resist layer 52 to obtain an interlayer dielectric layer 50 formed by the silicon oxide layer 51 and the organic photo-resist layer 52, and then patternizes the organic photo-resist layer 52 to form a connection hole 521 corresponding to above of the first contact hole 511 so that the subsequent source 33 and drain 34 are connected to the active layer 31 through the first contact holes 511 and the connection holes 521. By replacing the silicon nitride layer in the conventional interlayer dielectric layer with a flexible organic photo-resist layer 52 and providing a buffer hole 513 filled with an organic photo-resist material over the flexible base substrate 10, the flexibility of the flexible TFT substrate is greatly enhanced and the product performance improved.

Figure 6:
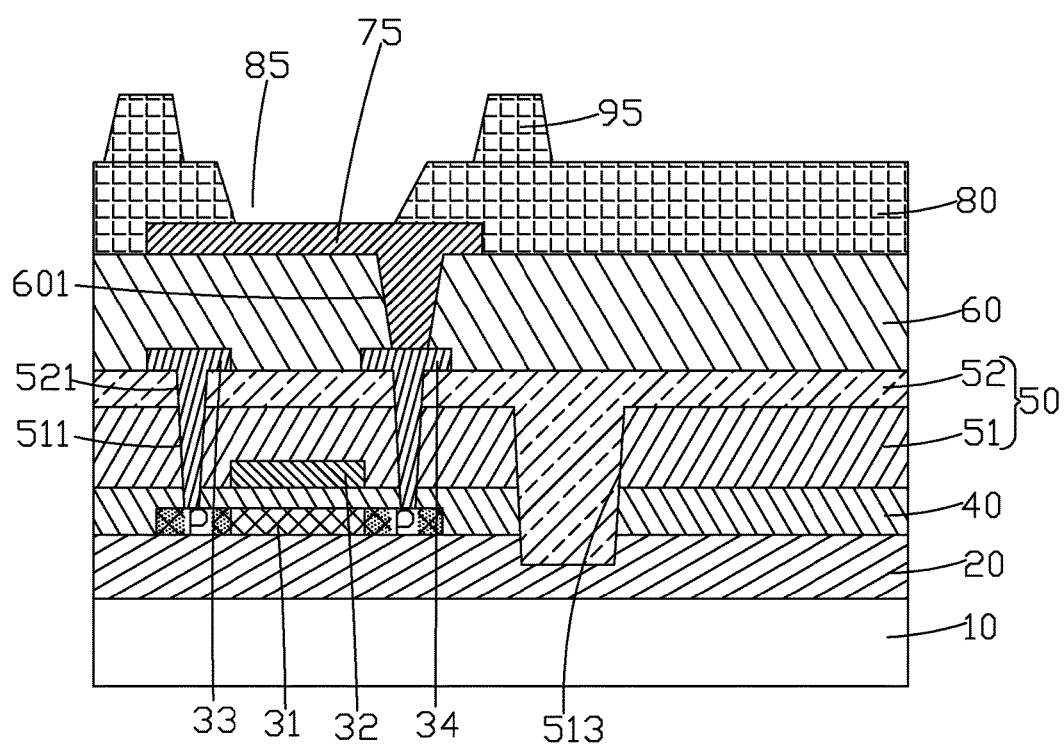
FIG. 6 is a schematic view showing Step S5 of the manufacturing method of flexible TFT substrate provided by a preferred embodiment of the present invention.

Specifically, the manufacturing method of flexible TFT substrate further comprises Step S5: as shown in FIG. 6, forming a planarization layer 60 on the source 33, the drain 34 and the interlayer dielectric layer 50, patternizing the planarization layer 60 to form a second contact hole 601 corresponding to above of the drain 34, depositing and patternizing on the planarization layer 60 to form a pixel electrode 75, the pixel electrode 75 contacting the drain 34 through the second contact hole 601, forming a pixel definition layer 80 on the pixel electrode 75 and the planarization layer 60, forming a supporter 95 on the pixel definition later 80.

Specifically, the manufactured flexible TFT substrate is used as the back plate of the OLED display device, and the pixel definition layer 80 is disposed with an opening 85 corresponding to above of the pixel electrode 75, wherein the opening 85 defines an OLED light-emitting area, and the pixel electrode 75 is an OLED anode.

Specifically, the gate 32, the source 33 and the drain 34 are made of one or more of the materials of molybdenum (Mo), aluminum (Al), copper (Cu), titanium (Ti), and chromium (Cr); moreover, the gate 33 is made of Mo, and the source 33 and the drain 34 are made of stacks of compound materials of Mo/Al/Mo layers.

Specifically, the buffer layer 20 and the gate insulating layer 40 are made of one or more of the materials of silicon oxide and silicon nitride, moreover, the buffer layer 20 is made of inorganic compound layer of SiOx+SiNx+SiOx.

Specifically, the pixel electrode 75 is made of a conductive compound layer of ITO/Ag/ITO.

Specifically, the pixel definition layer 80 and the support 95 are made of the same material and the same material is an organic photo-resist material, such as, PI; in Step S5, the pixel definition layer 80 and the support 95 are formed simultaneously by using a halftone mask plate. The pixel definition layer 80 and the supporter 95 is a monolithic structure.

In summary, the present invention provides a manufacturing method of flexible TFT substrate, wherein a first contact hole is formed above the two sides of the active layer and a buffer hole is formed on the flexible base substrate after depositing a silicon oxide layer of the interlayer dielectric layer, and then coating the organic photo-resist material on the silicon oxide layer and filling the organic photo-resist material into the buffer hole during the coating process to form an organic photo-resist layer to obtain an interlayer dielectric layer formed by the silicon oxide layer and the organic photo-resist layer, and then patternizing the organic photo-resist layer to form a connection hole corresponding to above of the first contact hole so that the subsequent source and drain are connected to the active layer through the first contact holes and the connection holes. By replacing the silicon nitride layer in the conventional interlayer dielectric layer with a flexible organic photo-resist layer and providing a buffer hole filled with an organic photo-resist material on the flexible base substrate, the flexibility of the flexible TFT substrate is greatly enhanced and the product performance improved.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of flexible TFT substrate, comprising the steps of:

Step S1: providing a flexible base substrate, depositing a buffer layer on the flexible base substrate, depositing and patternizing to form an active layer on the buffer layer, depositing a gate insulating layer on the active layer and the buffer layer, depositing and patternizing to form a gate on the gate insulating layer;

Step S2: depositing a silicon oxide layer on the gate and the gate insulating layer, patternizing the silicon oxide layer and the gate insulating layer to form a first contact hole respectively to corresponding to above of each of two sides of the active layer and form a buffer hole above the base substrate with an interval from the first contact hole, the first contact hole penetrating the silicon oxide layer and the gate insulating layer to expose the two sides of the active layer, the buffer hole having a larger size than the first contact hole, and the buffer hole having a deeper depth than the first contact hole;

Step S3: coating an organic photo-resist material on the silicon oxide layer to form an organic photo-resist layer, the organic photo-resist material filling the buffer hole during coating, the silicon oxide layer and the organic photo-resist layer together forming an interlayer dielectric layer, patternizing the organic photo-resist layer to form connection holes above the first contact holes so as to expose the first contact holes;

Step S4: depositing and patternizing on the interlayer dielectric layer to form a source and a drain, the source and the drain contacting respectively the two sides of the active layer through the first contact holes and the connection holes.

2. The manufacturing method of flexible TFT substrate as claimed in claim 1, wherein Step S2 of forming the first contact holes and the buffer hole specifically comprises: coating a photo-resist material on the silicon oxide layer, using a mask to perform exposure and lithography on the photo-resist material to obtain a shielding photo-resist layer, the shielding photo-resist layer comprising first openings and second openings to form the first contact holes and the buffer hole, using the shielding photo-resist layer as a shielding layer to perform dry etching on the silicon oxide layer and the gate insulating layer to form corresponding first contact holes beneath the first openings and form corresponding buffer holes beneath the second openings, and then removing the shielding photo-resist layer.

3. The manufacturing method of flexible TFT substrate as claimed in claim 1, wherein the buffer hole is wider than the first contact holes by 5-10 μm.

4. The manufacturing method of flexible TFT substrate as claimed in claim 1, wherein the organic photo-resist material is polyimide.

5. The manufacturing method of flexible TFT substrate as claimed in claim 1, wherein the manufacturing method of flexible TFT substrate further comprises Step S5: forming a planarization layer on the source, the drain and the interlayer dielectric layer, patternizing the planarization layer to form a second contact hole corresponding to above of the drain, depositing and patternizing on the planarization layer to form a pixel electrode, the pixel electrode contacting the drain through the second contact hole, forming a pixel definition layer on the pixel electrode and the planarization layer, forming a supporter on the pixel definition layer;

the pixel definition layer being disposed with an opening corresponding to above of the pixel electrode, the opening defining an OLED light-emitting area, and the pixel electrode being an OLED anode.

6. The manufacturing method of flexible TFT substrate as claimed in claim 5, wherein the pixel definition layer and the supporter are made of the same material, and the same material is an organic photo-resist material; in Step S5, the pixel definition layer and the supporter are formed simultaneously by using a halftone mask plate.

7. The manufacturing method of flexible TFT substrate as claimed in claim 1, wherein Step S1 of forming the active layer specifically comprises: depositing an amorphous silicon (a-Si) thin film on the buffer layer, converting the a-Si thin film into a polycrystalline silicon thin film by an excimer laser annealing crystallization process, and then patternizing the polycrystalline silicon thin film to obtain the active layer.

8. The manufacturing method of flexible TFT substrate as claimed in claim 1, wherein Step S1 further comprises: using the gate as a shielding layer to performing P-type doping on the two sides of the active layer.

9. The manufacturing method of flexible TFT substrate as claimed in claim 8, wherein when performing P-type doping in step S1, the ions doped into the active layer are boron ions.

10. The manufacturing method of flexible TFT substrate as claimed in claim 1, wherein the gate, the source and the drain are made of one or more of the materials of molybdenum (Mo), aluminum (Al), copper (Cu), titanium (Ti), and chromium (Cr); the buffer layer and the gate insulating layer are made of one or more of the materials of silicon oxide and silicon nitride.

11. A manufacturing method of flexible TFT substrate, comprising the steps of:
   Step S1: providing a flexible base substrate, depositing a buffer layer on the flexible base substrate, depositing and patterning to form an active layer on the buffer layer, depositing a gate insulating layer on the active layer and the buffer layer, depositing and patternizing to form a gate on the gate insulating layer;
   Step S2: depositing a silicon oxide layer on the gate and the gate insulating layer, patternizing the silicon oxide layer and the gate insulating layer to form a first contact hole respectively to corresponding to above of each of two sides of the active layer and form a buffer hole above the base substrate with an interval from the first contact hole, the first contact hole penetrating the silicon oxide layer and the gate insulating layer to expose the two sides of the active layer, the buffer hole having a larger size than the first contact hole, and the buffer hole having a deeper depth than the first contact hole;
   Step S3: coating an organic photo-resist material on the silicon oxide layer to form an organic photo-resist layer, the organic photo-resist material filling the buffer holes during coating, the silicon oxide layer and the organic photo-resist layer together forming an interlayer dielectric layer, patternizing the organic photo-resist layer to form connection holes above the first contact holes so as to expose the first contact holes;
   Step S4: depositing and patternizing on the interlayer dielectric layer to form a source and a drain, the source and the drain contacting respectively the two sides of the active layer through the first contact holes and the connection holes;
   wherein Step S2 of forming the first contact holes and the buffer hole specifically comprising: coating a photo-resist material on the silicon oxide, using a mask to perform exposure and lithography on the photo-resist material to obtain a shielding photo-resist layer, the shielding photo-resist layer comprising first openings and a second opening openings to form the first contact holes and buffer holes, using the shielding photo-resist layer as a shielding layer to perform dry etching on the silicon oxide layer and the gate insulating layer to form corresponding first contact holes beneath the first openings and form corresponding buffer hole beneath the second opening, and then removing the shielding photo-resist layer;
   wherein the buffer hole being wider than the first contact holes by 5-10 μm;
   wherein Step S1 of forming the active layer specifically comprising: depositing an amorphous silicon (a-Si) thin film on the buffer layer, converting the a-Si thin film into a polycrystalline silicon thin film by an excimer laser annealing crystallization process, and then patternizing the polycrystalline silicon thin film to obtain the active layer;
   wherein Step S1 further comprising: using the gate as a shielding layer to performing P-type doping on the two sides of the active layer;
   wherein the gate, the source and the drain being made of one or more of the materials of molybdenum (Mo), aluminum (Al), copper (Cu), titanium (Ti), and chromium (Cr); the buffer layer and the gate insulating layer being made of one or more of the materials of silicon oxide and silicon nitride.

12. The manufacturing method of flexible TFT substrate as claimed in claim 11, wherein the organic photo-resist material is polyimide.

13. The manufacturing method of flexible TFT substrate as claimed in claim 11, wherein the manufacturing method of flexible TFT substrate further comprises Step S5: forming a planarization layer on the source, the drain and the interlayer dielectric layer, patternizing the planarization layer to form a second contact hole corresponding to above of the drain, depositing and patternizing on the planarization layer to form a pixel electrode, the pixel electrode contacting the drain through the second contact hole, forming a pixel definition layer on the pixel electrode and the planarization layer, forming a supporter on the pixel definition layer;
   the pixel definition layer being disposed with an opening corresponding to above of the pixel electrode, the opening defining an OLED light-emitting area, and the pixel electrode being an OLED anode.

14. The manufacturing method of flexible TFT substrate as claimed in claim 13, wherein the pixel definition layer and the supporter are made of the same material, and the same material is an organic photo-resist material; in Step S5, the pixel definition layer and the supporter are formed simultaneously by using a halftone mask plate.

15. The manufacturing method of flexible TFT substrate as claimed in claim 11, wherein when performing P-type doping in step S1, the ions doped into the active layer are boron ions.

* * * * *